(12) United States Patent
Seward et al.

(10) Patent No.: US 12,498,404 B2
(45) Date of Patent: Dec. 16, 2025

(54) ASYNCHRONOUS PEAK HOLD CIRCUIT ON AN INTEGRATED CIRCUIT TRACE TO MONITOR FOR VOLTAGE SPIKES CAUSED BY AN ELECTROMAGNETIC PULSE

(71) Applicant: Silicon Laboratories Inc., Austin, TX (US)

(72) Inventors: DeWitt C. Seward, Arlington, MA (US); Attila Zolomy, Budapest (HU); Clayton Daigle, Austin, TX (US); Jeffrey Tindle, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 26 days.

(21) Appl. No.: 17/957,214

(22) Filed: Sep. 30, 2022

(65) Prior Publication Data

US 2024/0110954 A1 Apr. 4, 2024

(51) Int. Cl.
*G01R 19/04* (2006.01)
*H03K 5/1532* (2006.01)

(52) U.S. Cl.
CPC ........... *G01R 19/04* (2013.01); *H03K 5/1532* (2013.01)

(58) Field of Classification Search
CPC ..... G01R 19/04; G01R 31/002; H03K 5/1532
See application file for complete search history.

(56) References Cited

U.S. PATENT DOCUMENTS

| | | | |
|---|---|---|---|
| 9,557,355 B2 | 1/2017 | Swoboda | |
| 10,228,415 B1 | 3/2019 | Koay | |
| 10,785,016 B2 | 9/2020 | Seward | |
| 11,366,898 B2 | 6/2022 | Sonntag et al. | |
| 2013/0142237 A1* | 6/2013 | Drooghaag | H04B 3/46 375/224 |
| 2018/0349600 A1 | 12/2018 | Elenes et al. | |
| 2019/0013281 A1 | 1/2019 | Elenes et al. | |
| 2019/0189390 A1* | 6/2019 | Nelson, Sr. | G21K 5/04 |
| 2020/0034544 A1 | 1/2020 | Cooreman | |
| 2020/0243152 A1* | 7/2020 | Wappis | H03M 1/1245 |
| 2021/0150027 A1* | 5/2021 | Sonntag | G06F 21/556 |
| 2023/0065352 A1 | 3/2023 | O'Connell | |

(Continued)

OTHER PUBLICATIONS

Kelley, H., and Alonso, G., "LTC6244 High Speed Peak Detector," Analog Devices, Inc., 1995-2022, downloaded from https://www.analog.com/en/technical-articles/ltc6244-high-speed-peak-detector.html, Aug. 17, 2022.

(Continued)

*Primary Examiner* — Lee E Rodak
*Assistant Examiner* — Zannatul Ferdous
(74) *Attorney, Agent, or Firm* — Zagorin Cave LLP

(57) ABSTRACT

An electromagnetic pulse detector in an integrated circuit includes one or more peak hold circuits coupled to one or more traces in the integrated circuit and configured to asynchronously detect voltage spike(s) on the one or more traces and store voltage value(s) corresponding to the voltage spike(s). One or more comparator circuits are coupled to the peak hold circuits to compare the voltage values corresponding to the voltage spikes to one or more threshold voltage values. Storage locations are coupled to the comparator circuits to store indications of the voltage spike(s) being greater than the threshold voltage value to thereby indicate detection of an electromagnetic pulse.

21 Claims, 7 Drawing Sheets

(56) References Cited

U.S. PATENT DOCUMENTS

2024/0271919 A1\* 8/2024 Clark .................. G01B 7/003
2025/0060409 A1 2/2025 Rueger et al.

OTHER PUBLICATIONS

Nemiroff, D., and Tokunaga, C., "Tunable Replica Circuit for Fault-Injection Detection," Blackhat USA 2022, Aug. 10, 2022, 31 pages.

\* cited by examiner

ASYNCHRONOUS PEAK HOLD CIRCUIT ON AN INTEGRATED CIRCUIT TRACE TO MONITOR FOR VOLTAGE SPIKES CAUSED BY AN ELECTROMAGNETIC PULSE

BACKGROUND

Field of the Invention

This disclosure relates to detection of electromagnetic pulses on integrated circuits.

Description of the Related Art

Various kinds of attacks have been used against integrated circuits to breach security barriers. For example, power supply glitch attacks that insert a glitch in the power being supplied to the integrated circuit are well known. Glitching attacks can be used to cause the integrated circuit to malfunction allowing the attacker to extract secret keys, open up a locked debug port, or force a chip to accept and run improperly signed firmware, thus allowing access to functionality that ordinarily would not be available. Power supply glitch detection circuits are a well-known technology. But these circuits are focused on looking for glitches on the input power supply lines themselves.

Electromagnetic pulse (EMP) glitching is rapidly becoming a practical glitching security attack on silicon chips with no good way to mitigate or detect these attacks. An EMP glitching attack directs an electromagnetic pulse towards an integrated circuit, which causes a voltage spike in the integrated circuit leading to malfunctions. EMP glitches can circumvent power supply glitch detection and mitigations because the EMP creates glitches on the power traces on the silicon. Power supply input mitigations and detection circuits do not have the ability to deal with glitches introduced on power supply traces by an EMP. Generally, one way to mitigate against glitching attacks is with redundant hardware. For example, if the calculation result of duplicated hardware does not agree, the system can reset and rerun the calculation or take other appropriate action. However, duplicate hardware is both expensive in silicon area and power consumption and that approach can require foreknowledge of attack vectors. Also, such an approach will not help prevent new EMP glitch based attack vectors.

Several approaches have been used to detect an EMP attack. One approach uses synchronous detection techniques that rely on circuit behaviors that occur around a clock pulse in the integrated circuit. However, EMP pulses can be very short, e.g., 0.5-5 ns while a clock frequency used in an internet of things (IOT) chip is, e.g., 80 MHz or a period of 12.5 ns. One synchronous approach uses a high frequency clock signal (>1 GHz) for detection, but that approach requires significant increased power for the high frequency clock signal, which is undesirable particularly for an IOT application. Thus, many voltage spikes induced by an EMP attack go undetected if they do not properly align with the clock pulse or if they are too short to be detected. These short pulses can still generate exploit behavior. Another detection approach uses loops built into metal layers of the integrated circuit. That approach relies on detection of current induced in the metal loops by the magnetic field of the EMP to indicate an EMP attack. However, the current loops are not sufficiently sensitive to an EMP. Unless the pulse is received close to the loop, the EMP goes undetected. In addition, the loops are costly in terms of routing area. Accordingly, improved techniques for detecting EMP attacks is desirable.

SUMMARY OF EMBODIMENTS OF THE INVENTION

The ability to detect EMP attacks is becoming an important defense in silicon chip security. Accordingly, in one embodiment a method includes asynchronously detecting and holding a voltage value corresponding to a peak voltage present on a conductive trace in an integrated circuit and synchronously storing an indication that the peak voltage on the conductive trace is a voltage spike indicative of an electromagnetic pulse responsive to the voltage value being above a threshold voltage value.

In another embodiment an integrated circuit includes a conductive trace and a peak hold circuit coupled to the conductive trace and the peak hold circuit is configured to asynchronously detect a peak voltage on the conductive trace and store a voltage corresponding to the peak voltage. A comparator is coupled to the peak hold circuit to compare the peak voltage to a threshold voltage value. A storage location is coupled to the comparator and stores an indication of whether the peak voltage is above the threshold voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
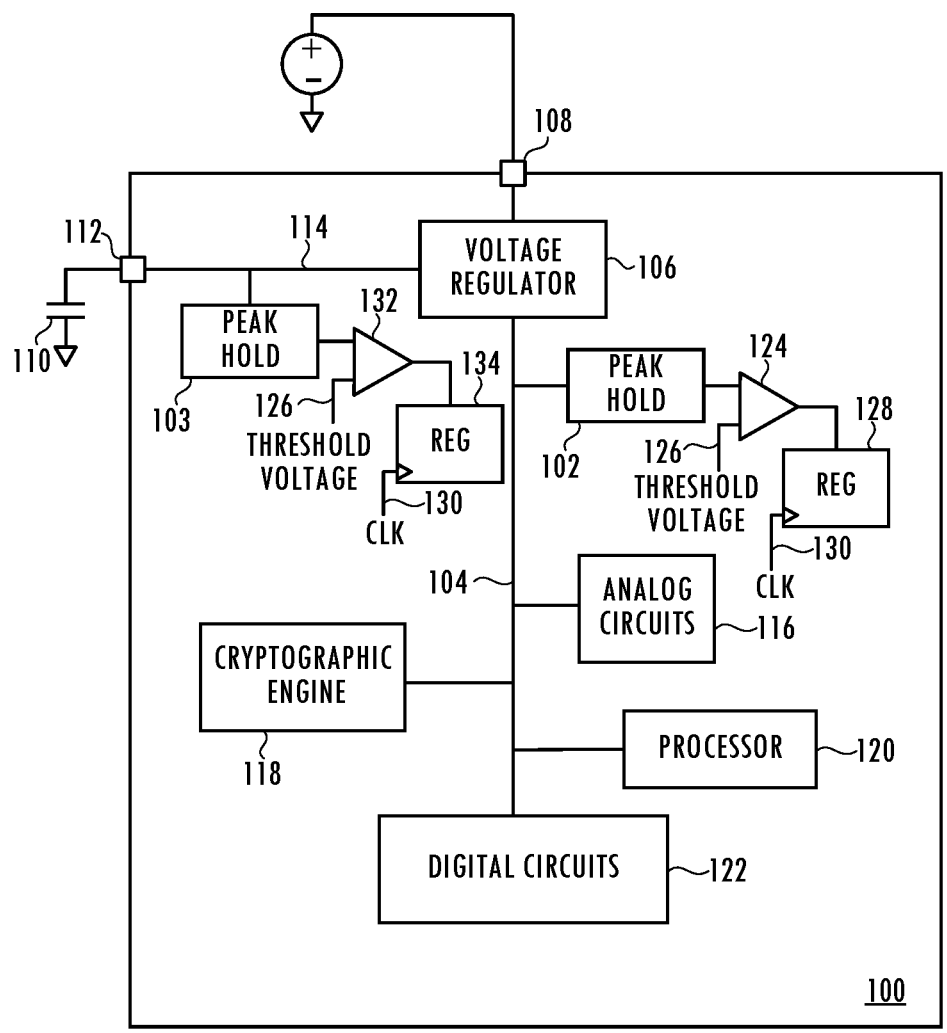
FIG. 1 is a high level block diagram of a system with asynchronous peak hold circuits to detect the occurrence of induced voltage spikes caused by an EMP attack.

Instead of the synchronous approach to detect an EMP attack or using loops in the metal layers to detect an EMP attack, embodiments described herein use asynchronous voltage peak detection circuits combined with a synchronous evaluation of the peak voltage to determine if a voltage spike has occurred that is indicative of an EMP attack. Embodiments described herein use asynchronous peak hold circuits on the long traces in the integrated circuit to detect voltage peaks. Semiconductor circuits utilize several major traces to route power (typically including one or more positive voltage traces and one or more ground voltage traces) to specific parts of the chip. In the simplified high level block diagram of the integrated circuit 100 shown in FIG. 1, a single voltage regulator 106 receives a DC voltage at input terminal 108. The voltage regulator 106 supplies a regulated voltage on trace 104 to various regions of the integrated circuit including analog circuits 116, the cryptographic engine 118, a processor 120, and other digital logic 122. An asynchronous peak hold circuit 102 is coupled to the trace 104 to detect voltage spikes on the power supply trace 104 induced by an EMP. While the embodiment of FIG. 1 shows a single voltage regulator 106, other embodiments utilize multiple voltage regulators to supply power independently to specific parts of the chip. The voltage regulator includes an external decoupling capacitor 110 that is coupled to the voltage regulator 106 through terminal 112 and trace 114. An asynchronous peak hold circuit 103 is coupled to the trace 114 to detect induced voltage spikes on the trace 114. When an electromagnetic pulse (EMP) is directed to integrated circuit 100, the long traces act like an antenna, and the EMP induces short-duration voltage spikes on long traces. The long traces in the embodiment shown in FIG. 1 include the power trace 104 supplying power to various chip regions and the trace 114 coupling the decoupling capacitor to the voltage regulator. The induced pulses are often much shorter (e.g., 0.5 to 5 nanoseconds in duration) than a typical clock frequency (e.g., 80 MHz) of an IoT device and thus cannot generally be detected with a synchronous detector without a high speed clock. Note that while power supply traces are typically appropriate locations to place one or more peak hold circuits, embodiments place one or more peak hold circuits on any sensitive trace (typically a long trace) that is sensitive to an EMP attack and would reflect a voltage spike indicative of an EMP attack.

The integrated circuit 100 overcomes the problem of synchronous detection using the peak hold circuits 102 and 103. The peak hold circuit 102 detects and stores the peak voltage seen on trace 104. Comparator 124 receives the peak voltage from peak hold circuit 102 and compares the peak voltage to the threshold voltage 126. In one or more embodiments the threshold voltage 126 is programmable. Storage location 128 stores the results of the comparison operation responsive to, e.g., a rising (or falling) edge of the clock signal 130. Thus, while the detection of the peak voltage is asynchronous, the results of the comparison are stored synchronously. The storage location 128 may be a flip-flop, a register as shown in FIG. 1, or any suitable storage location. In embodiments, the storage location 128 is accessible to processor 120, digital logic 122, or both. Although storage location 128 is shown separately, it may be part of digital circuits 122 or even processor 120.

Peak hold circuit 103 is coupled to the trace 114, which couples the voltage regulator to the decoupling capacitor 110. The peak hold circuit 103 detects and stores the peak voltage on trace 114. Comparator 132 receives the peak voltage from peak hold circuit 103 and compares the peak voltage to the threshold voltage 126. In one or more embodiments the threshold voltage 126 is programmable. Storage location 134 stores the results of the comparison operation responsive to, e.g., a rising (or falling) edge of the clock signal 130. Thus, while the detection of the peak voltage is asynchronous, the results of the comparison are stored synchronously The storage location 134 may be a flip-flop, a register, or any suitable storage location. In embodiments, the storage location 134 is accessible to processor 120, digital logic 122, or both. Storage location 134 may be a bit in the same register as storage location 128. Although storage location 134 is shown separately, the storage location may be part of digital circuits 122 or even processor 120.

While FIG. 1 shows two peak hold circuits 102 and 103, embodiments may include only one peak hold circuit or more than two peak hold circuits, e.g., 8 or 16 peak hold circuits to monitor the power traces and/or other long traces in the integrated circuit. Note that while trace 104 is coupled to the power trace supplying the supply voltage, e.g., VDD, in embodiments, one or more detector circuits are also coupled to one or more power traces that supply a ground voltage or other voltages to the circuits. The additional peak hold circuits, comparator circuits, and storage locations monitor the power traces (and/or other long traces if desired) and determine when the peak voltage exceeds a configurable threshold.

Having a plurality of peak hold circuits allows flexibility in responding to detections of voltage spikes. For example, a majority of 16 detectors detecting a voltage spike that exceeds the threshold indicates with some certainty that the integrated circuit has been the object of an EMP attack. If only one or two detectors detect the voltage spike, the one or two voltage spikes may indicate an EMP attack, but there is less certainty that the integrated circuit has been the subject of an EMP attack. The actions taken to a suspected EMP attack may be different based on the level of certainty. For example, some embodiments may reset the integrated circuit responsive to a low level of certainty but disable the integrated circuit responsive to a high level of certainty by erasing a critical piece of information needed for the integrated circuit to work or properly boot up. In embodiments, the threshold for the various detectors are individually configurable. In other embodiments, multiple detectors, or all of the detectors have the same threshold. While some embodiments use a configurable threshold, in other embodiments, the threshold is fixed. However, having a configurable threshold may prove more practical by reducing the occurrence of false alarms.

Figure 2:
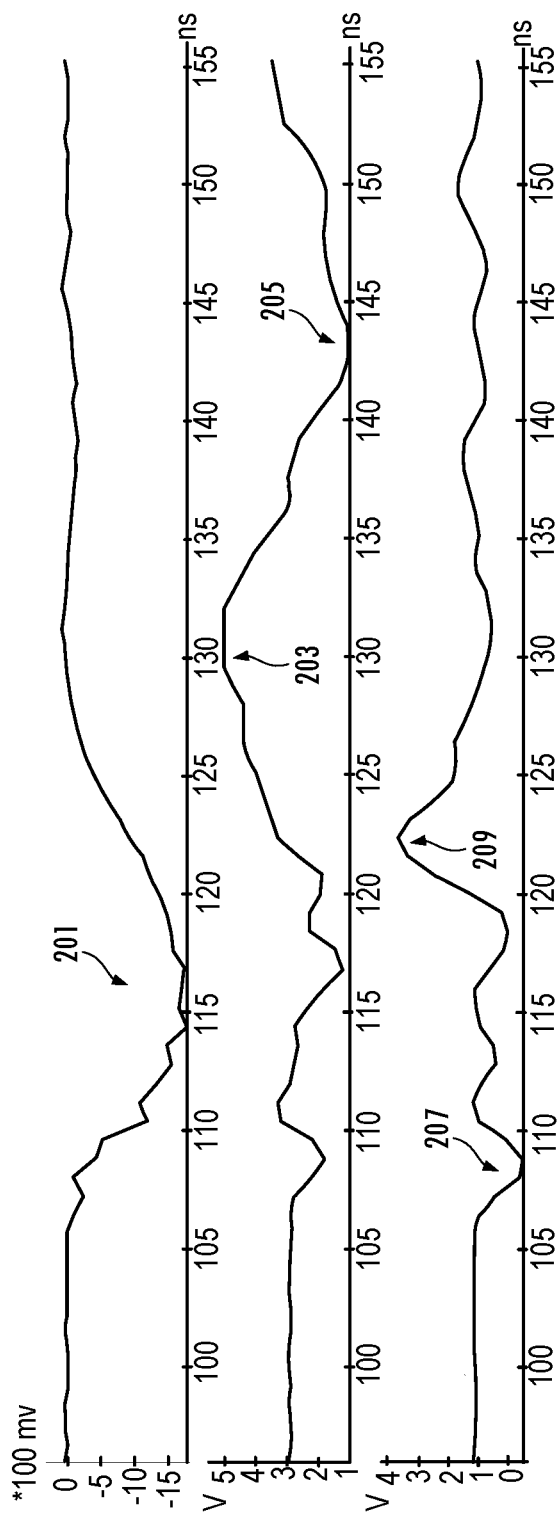
FIG. 2 illustrates the effect an EMP attack has on voltages within the integrated circuit.

FIG. 2 illustrates the effect of an EMP attack on the supply voltages of an integrated circuit. The pulse through the coil in the EMP generating circuit is shown at 201. A voltage swing of ±2V around a nominal 3V supply voltage being supplied to the voltage regulator in the integrated circuit is shown at 203 and 205. The 1.1V nominal supply voltage being supplied to digital logic drops negative at 207 and spikes positive at 209 on the 1.1V power plane. Note that the duration of the induced voltages spikes is approximately 5 ns or less. Both negative voltage spikes and positive voltage spikes can result in a random state of digital logic. Thus, the digital logic can make a bad decision if a true condition becomes false or vice versa due to the voltage spike or a 1 becomes a 0 or vice versa during, e.g., an Advanced Encryption Standard (AES) computation. Such bad decisions can allow for exploits. If those exploits were detected, appropriate remedial action can be taken. Asynchronously detecting the occurrence of voltage spikes can assist in detecting such EMP exploit attempts.

Figure 3A:
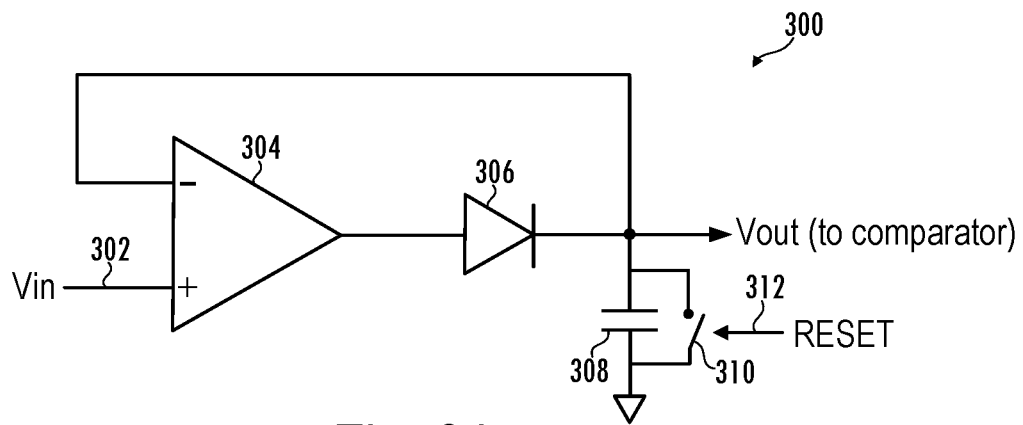
FIG. 3A illustrates an embodiment of a positive peak hold circuit.
Figure 3B:
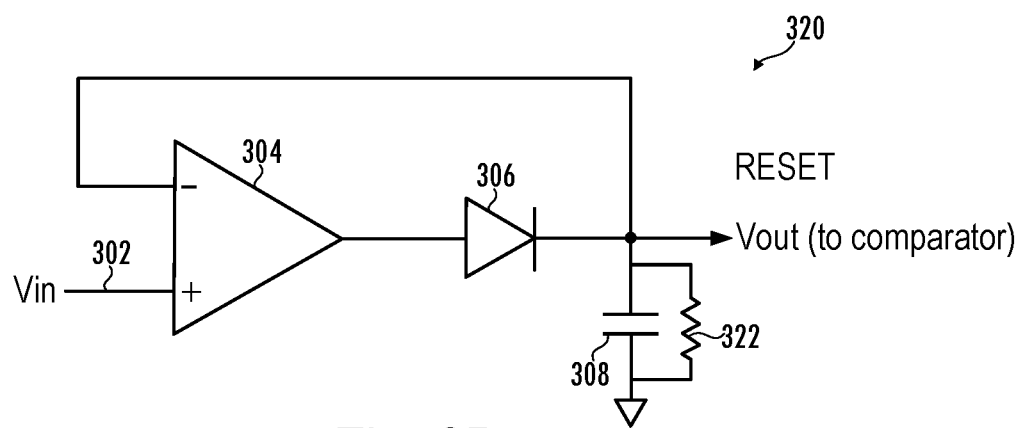
FIG. 3B illustrates another embodiment of a positive peak hold circuit.

Peak detection circuits that can be utilized in the integrated circuit 100 of FIG. 1 are well known to those of skill in the art. FIG. 3A illustrates a peak hold circuit 300 that conceptually illustrates the operation of a positive peak detection circuit for detection of a positive voltage spike. The input voltage 302 is supplied to amplifier 304. Diode 306 receives the output from the amplifier 304 that corresponds to the input voltage 302. Capacitor 308 receives charging current from the amplifier 304 through the diode 306 assuming the voltage difference across the diode is sufficient to forward bias the diode. Ignoring the diode voltage drop, the capacitor charges up to the input voltage 302. If the input voltage 302 drops below the stored voltage in capacitor 308, the diode 306 becomes reverse biased and the capacitor retains the charge corresponding to the peak input voltage seen. That stored peak voltage is then supplied to the comparator as described with relation to FIG. 1. After the comparison operation takes place and the clock signal asserts causing the results of the compare operation to be stored, control logic, e.g., in processor 120 or digital circuits 122 (see FIG. 1) cause the peak hold circuit 300 to be reset by closing switch 310 responsive to assertion of the reset signal 312. The reset operation may take place, e.g., a short delay implemented with a suitable delay circuit after storing the compare result that is sufficient to meet any set up and hold times of the storage device. In other embodiments the reset takes place on the next rising edge of the clock signal after the results of the compare operation have been stored or at some other times according to system needs. The switch 310 is then opened after the capacitor has been reset to allow for the next peak detection to take place. FIG. 3B illustrates another embodiment of a peak hold circuit 320 that uses a resistor 322 to discharge the capacitor 308. That approach avoids the need for the switch 310 and reset signal 312 shown in FIG. 3A.

Figure 4A:
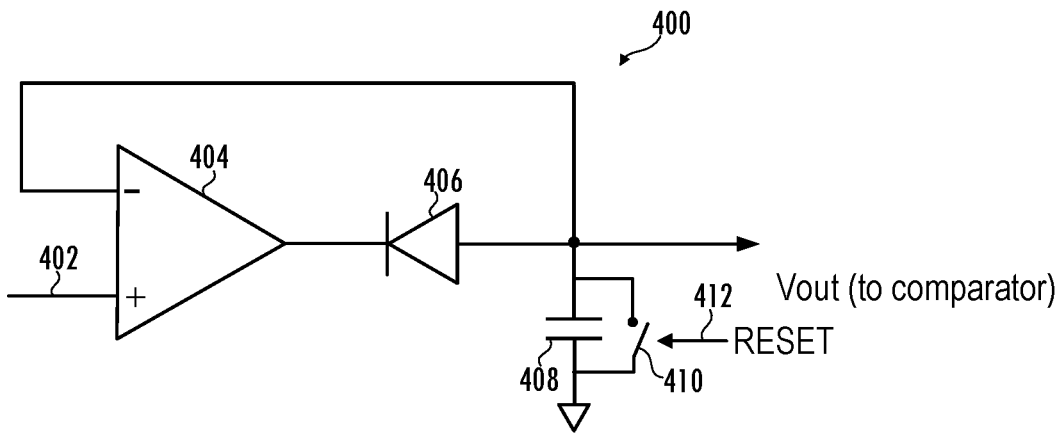
FIG. 4A illustrates an embodiment of a negative peak hold circuit.
Figure 4B:
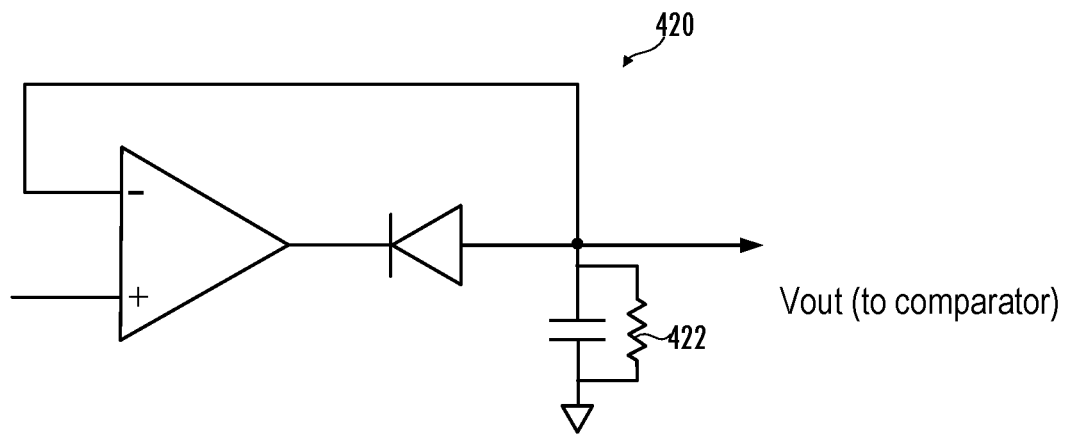
FIG. 4B illustrates another embodiment of a negative peak hold circuit.

As shown in FIG. 2, the induced voltage spikes can be both positive and negative. Thus, some embodiments use negative peak hold circuits instead of, or in addition to, positive peak hold circuits. FIG. 4A illustrates conceptually operation of a negative peak hold circuit 400. Amplifier 404 receives the input voltage 402 and supplies the input voltage to the diode 406. The capacitor 408 only charges negatively if the diode 406 is forward biased meaning the input voltage 402, as reflected by the output of the amplifier 404, is sufficiently negative. The voltage across the capacitor reflects the most negative voltage seen on input 402. The reset switch 410 resets the negative peak hold circuit responsive to the reset signal 412 after the comparison operation takes place. FIG. 4B illustrates another embodiment of a negative peak hold circuit 420 that uses a resistor 422 to discharge the capacitor 408. That approach avoids the need for the switch 410 and reset signal 412 shown in FIG. 4A. Note that the simple positive and negative peak hold circuits shown in FIGS. 3A-4B are shown so the operation of peak hold circuits can be simply explained. Those of skill in the art understand the need to use appropriate and well known high speed peak hold circuits to detect the short duration pulses, e.g., 0.5-5 ns, expected on the sensitive traces in response to an EMP attack. The object of the embodiments illustrated in FIGS. 3A, 3B, 4A, 4B, is to detect and hold the peak voltage long enough for clock-synchronous circuitry to latch the peak. There are many ways to achieve that goal. For example, one approach uses a diode and capacitor without the operational amplifier used in the embodiments of FIGS. 3A-4B. As a practical matter, using the operational amplifier as shown in FIGS. 3A-4B may require that the operational amplifier to have a power supply higher than the power supply rail (an increase of a diode drop) so the peak voltage can be accurately tracked. In other embodiments the diode voltage drop is accounted for, e.g., with a lower threshold voltage being supplied to the comparator.

Figure 5:
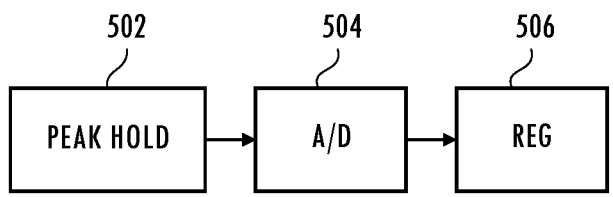
FIG. 5 illustrates an embodiment that uses an analog-to-digital converter in place of an analog comparator.

While some embodiments use peak hold circuits as the voltage spike detection circuits to detect the existence of the short duration pulses induced by an EMP attack, any voltage spike detection circuit that detects short duration (e.g., 0.5 to 5 ns) voltage spikes can also be used. In addition, some embodiments may not use comparator circuits with all (or any) of the peak hold circuits. For example, FIG. 5 illustrates an embodiment in which the peak hold circuit 502 supplies the stored peak voltage to an analog-to-digital converter (A/D) 504, which converts the stored voltage value of the peak hold circuit to a digital value and stores that digital value in storage 506. In that way a programmed processor or other synchronous digital logic compares the digital peak voltage in storage 506 to a threshold voltage value to determine if the peak voltage exceeds a threshold value thereby indicating a voltage spike resulting from an EMP attack. In addition, the actual size of the voltage spike will also be known, which can be useful for analysis purposes.

Figure 6:
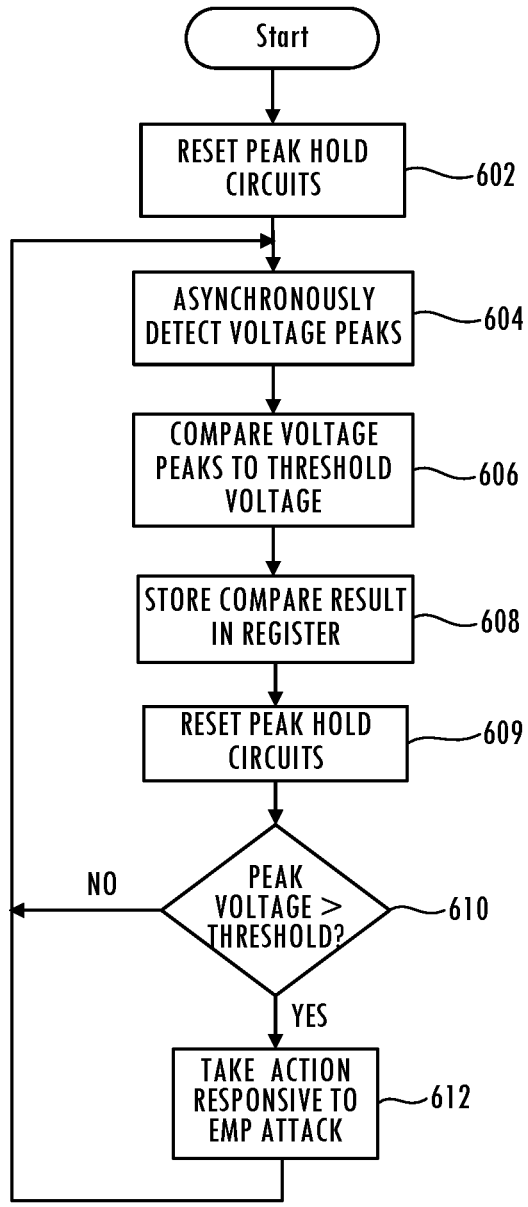
FIG. 6 illustrates a flow chart of operation of EMP detection according to an embodiment.

FIG. 6 depicts a high level flow chart illustrating detection of an EMP attack according to an embodiment. In 602, the peak hold circuit(s) are reset. That may be an active reset as shown in FIGS. 3A and 4A using switches 310 or 410 or the capacitor may be discharged passively through a resistor as shown in FIGS. 3B and 4B. In 604 the peak hold circuits asynchronously detect the peak voltage that has occurred since the peak hold circuits were reset. In 606 the peak voltages from the peak hold circuits are compared to the threshold voltage(s) in comparators or compared digitally if an A/D circuit is used to convert the peak voltage to a digital value. The threshold voltage may be the same for all the comparators or may be different for one or more of the peak hold circuits. In 608 the comparison results are stored in an appropriate register or other storage location. In some embodiments the comparison results are only stored if the comparison result indicates the peak voltage is above threshold. Thus, for example, the register containing bits indicating the comparison result are reset to 0s every detection cycle and only those bits indicating the threshold voltage was exceeded by the peak voltage are updated to a "1". Once the results are stored, the peak hold circuits are reset in 609. That may be an active reset as shown in FIGS. 3A and 4A using switches 310 or 410 or the capacitor holding the peak voltage may be discharged passively through a resistor as shown in FIGS. 3B and 4B. If the comparison results show that none of the peak hold circuits detected a voltage above the threshold in 610, the flow returns to 604 to continue the asynchronous detection that started after the reset was completed. If the comparison results show the peak voltage is above the threshold for one or more of the compare operations, the control logic, e.g., processor 120 (FIG. 1) takes appropriate action in 612. The appropriate action may depend on how many peak voltages were detected that were above the threshold. For example, if there are 16 peak hold circuits the action taken may differ if a majority of the peak hold circuits detected a voltage spike above the threshold as compared to a detection of a voltage spike by only one peak hold circuit. In addition, the particular application in which the integrated circuit is used may affect the action taken in response to a detected EMP attack. The actions taken in response to an EMP attack range from taking no action, logging the attack, redoing a calculation, resetting the integrated circuit, permanently disabling the integrated circuit, or taking any other appropriate action to respond to the EMP attack based on the particular system. Once the appropriate action is taken in 612 the flow returns to 604 (if needed) to continue detecting voltage peaks.

Note that in the example previously given with an 80 MHz clock (12.5 ns period), the detection cycle lasts from reset of the detection circuits to the compare operation, which is synchronous since the compare result is stored in synchronism with the clock. The reset may occur, e.g., on the same cycle that the compare operation results are stored but delayed by a sufficient amount to ensure the results are stored meeting any setup and hold time requirements before the reset occurs. Alternatively, the reset may occur half a clock cycle or more than a half cycle after the store takes place or may be implemented passively with a resistor. In addition, the reset takes some time for the capacitor to discharge. If there is any significant delay between storing the compare results and resetting the compare results, there will be a gap between the storing and completion of the reset. Thus, the system can still miss some short induced voltage spikes if all the results from all the peak hold circuits are compared at the same time and the peak hold circuits are all reset at the same time. Thus, in embodiments only half (or some other percentage) of the peak hold circuits are compared and reset at any one time to ensure that detection continues between the compare and reset operation. In such an embodiment, in the next detection cycle, the other half of the peak hold circuits are compared and reset. Thus, one group of peak hold circuits is always functional looking for voltage spikes caused by an EMP attack.

Figure 7:
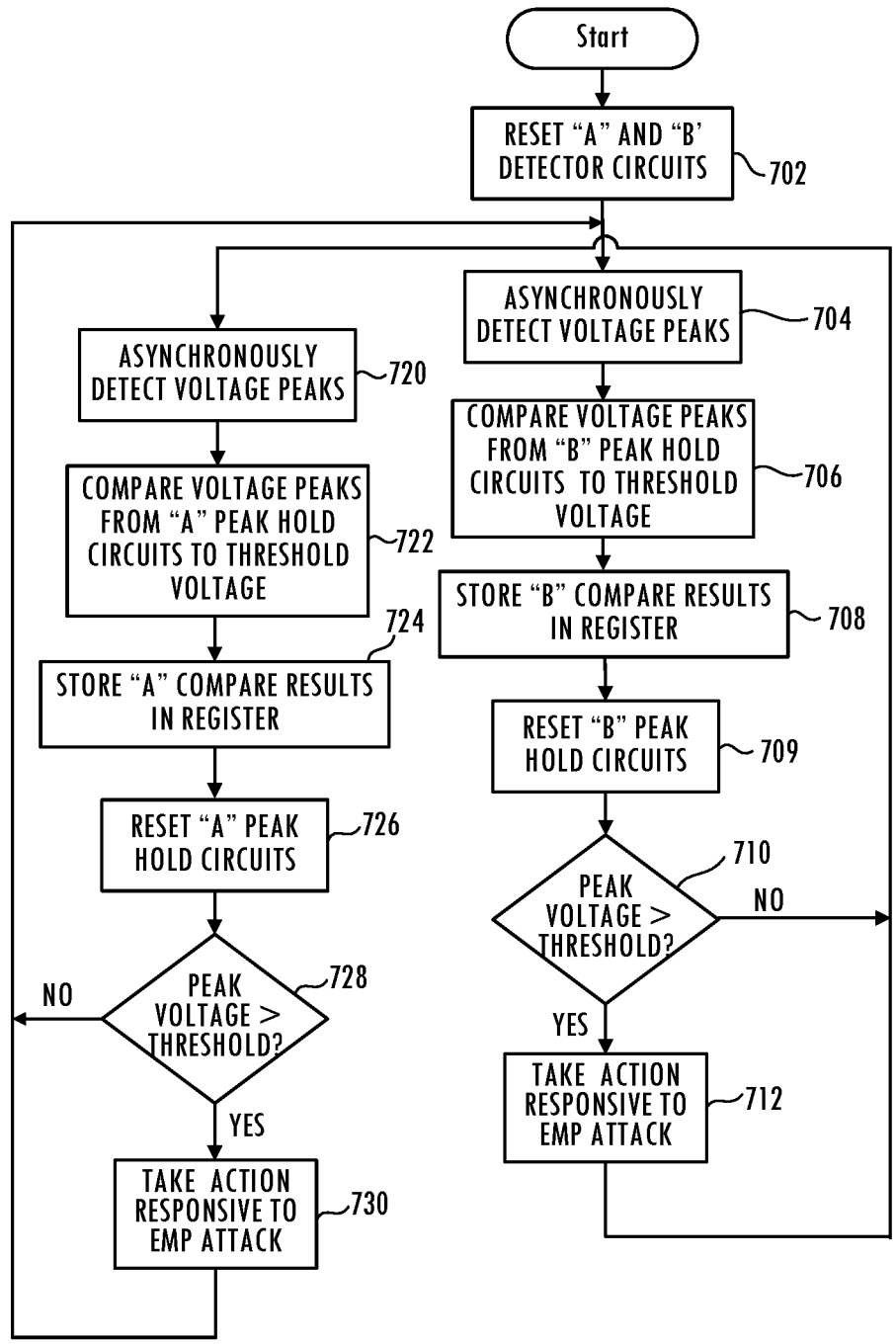
FIG. 7 illustrates a flow chart of operation of EMP detection according to another embodiment.

FIG. 7 illustrates an embodiment in which half (or other predetermined number) of the peak hold circuits are compared and reset during each detection cycle. A detection cycle lasts, e.g., from one to several system clock cycles. Assume the peak hold circuits are divided to groups "A" and "B". In 702, all the peak hold circuit(s) are reset actively or passively. In 704 the peak hold circuits asynchronously detect the peak voltage that has occurred since the peak hold circuits were reset. In 706 the peak voltages from the "B" peak hold circuits are compared to the threshold voltage(s) in comparators or compared digitally if A/D circuit(s) are used to convert the peak voltage to a digital value. The threshold voltage may be the same for all the comparators or may be different for one or more of the peak hold circuits. In 708 the comparison results from the "B" peak hold circuits are stored in an appropriate register or other storage location. In some embodiments the comparison results are only stored if the comparison result indicates the peak voltage is above threshold. Thus, for example, the register containing bits indicating the comparison result are reset every detection cycle and only those bits indicating the threshold voltage was exceeded by the peak voltage are updated when a peak voltage over threshold is detected. Once the results are stored, the "B" peak hold circuits are reset actively or passively in 709. If the comparison results show that none of the peak hold circuits detected a voltage above the threshold in 710, the flow returns to 720 to continue the asynchronous detection that started after the reset was completed.

In 722 the peak voltages from the "A" peak hold circuits are compared to the threshold voltage(s) in comparators or compared digitally if A/D circuit(s) are used to convert the peak voltages to digital values. The threshold voltage may be the same for all the comparators or may be different for one or more of the peak hold circuits. In 724 the comparison results from the "A" peak hold circuits are stored in an appropriate register or other storage location. In some embodiments the comparison results are only stored if the comparison result indicates the peak voltage is above threshold. Once the results are stored, the "A" peak hold circuit circuits are reset in 726 actively or passively. If the comparison results show that none of the peak hold circuits detected a voltage above the threshold in 728, the flow returns to 704 to continue the asynchronous detection that started after the reset was completed.

If the comparison results in 710 show the peak voltage is above the threshold for one or more of the compare operations, the control logic, e.g., processor 120 (FIG. 1) takes appropriate action in 712. The appropriate action may depend on how many peak voltages were detected that were above the threshold. For example, if there are 16 peak hold circuits the action taken may differ if a majority of the peak hold circuits detected a voltage spike above the threshold as compared to a detection of a voltage spike by only one peak hold circuit. In an embodiment, a voltage spike by only one peak hold circuit may be ignored. In addition, the particular application in which the integrated circuit is used may affect the action taken in response to a detected EMP attack. The actions taken range from taking no action, logging the attack, redoing a calculation, resetting the integrated circuit, permanently disabling the integrated circuit, or taking any other appropriate action to respond to the EMP attack. Once the appropriate action is taken is 712 the flow returns to 720 (if needed) to continue asynchronous detection of voltage spikes.

Similarly, if the comparison results in 728 show the peak voltage is above the threshold for one or more of the compare operations, the control logic, e.g., processor 120 (FIG. 1) takes appropriate action in 730. Once the appropriate action is taken in 712 the flow returns to 720 (if needed) to continue asynchronous detection of voltage spikes.

Figure 8:
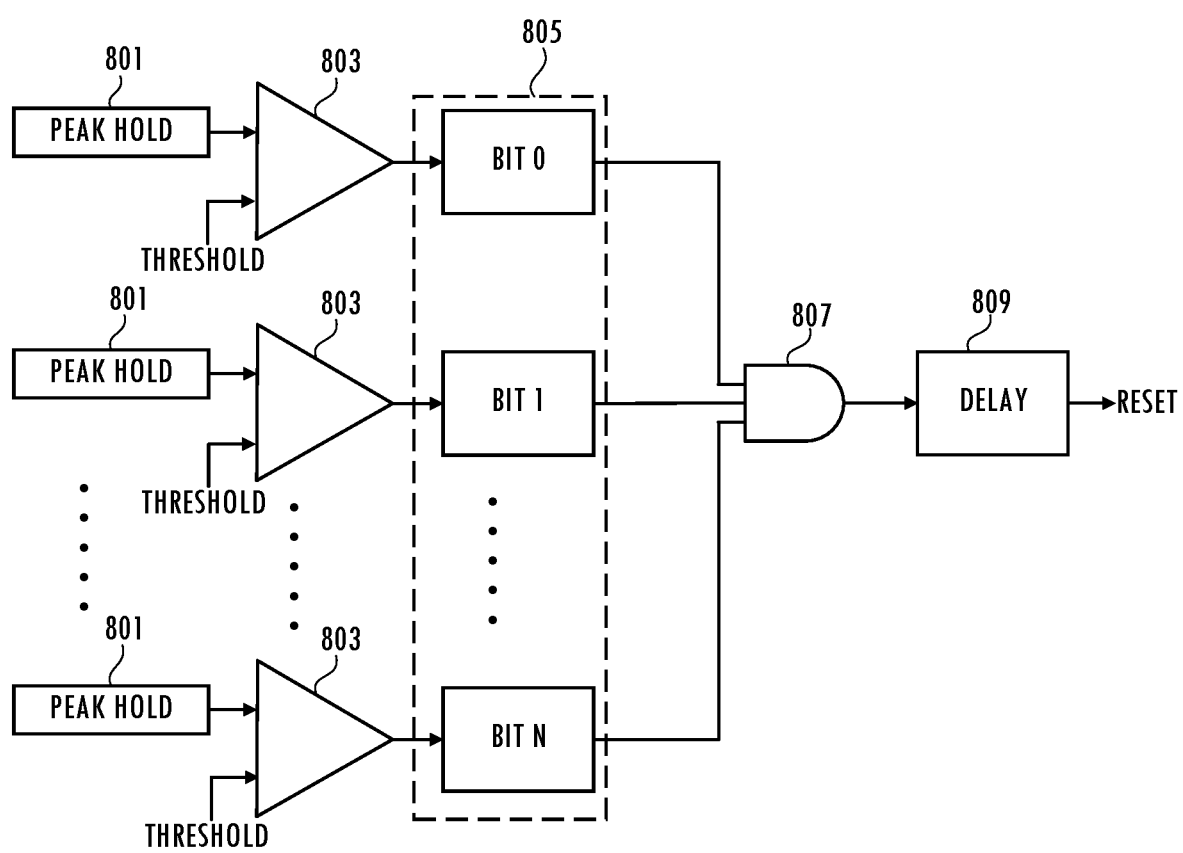
FIG. 8 illustrates a circuit that responds to an EMP attack with a reset without processor intervention.

While EMP attacks typically try to target specific points in device code rather than perform a blanket attack on the device, future attacks may be so strong, e.g., with a burst of pulses, that the processor cannot read out the results of peak hold circuits and take the necessary action. Rather than rely on the processor to take appropriate action in response to the attack, e.g., a reset or other action, in an embodiment circuits automatically take appropriate action even without processor intervention. For example, referring to FIG. 8, if a sufficient number of sample hold circuits detect a voltage spike exceeding a threshold, which is indicative of an EMP attack, the device is forced into a reset state. FIG. 8 illustrates a plurality of sample hold circuits 801, a plurality of compare circuits 803, and an N bit register 805 that stores the output of the sample hold circuits, N being an integer of 3 or more. In the embodiment of FIG. 8, if all the samples are set to 1 a reset signal 807 asserts (after delay 809) without the need for the processor to intervene. The delay circuit 809 allows the processor to intervene and to take action other than a reset if desired if the processor is not disabled by the attack. The delay circuit can be implemented as a series of flip-flops or in any manner suitable to achieve the desired delay. While the embodiment of FIG. 8 assumes all the peak detector circuits detected a voltage spike for the reset to assert after the delay, other embodiments can utilize any appropriate majority circuit suitable for the application. If the attack continues or is repeated after the reset, the device keeps entering the reset state to prevent a successful attack.

Thus, embodiments to detect an EMP attack using asynchronous peak hold circuits have been described. The description of the invention set forth herein is illustrative and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method for detecting an electromagnetic pulse comprising:
   providing a regulated voltage from a voltage regulator to a positive power supply trace in an integrated circuit;
   supplying a voltage from the positive power supply trace to a peak hold circuit to detect a voltage spike on the positive power supply trace indicative of an electromagnetic pulse;
   asynchronously detecting in the peak hold circuit a peak voltage on the positive power supply trace and holding in the peak hold circuit a sensed voltage indicative of the peak voltage;
   comparing the sensed voltage to a threshold voltage and generating a comparison result; and
   synchronously storing the comparison result using a clock signal, the comparison result indicating whether the peak voltage on the positive power supply trace is the voltage spike indicative of an electromagnetic pulse.

2. The method as recited in claim 1 further comprising storing the sensed voltage in a capacitor of the peak hold circuit.

3. The method as recited in claim 1 further comprising:
   asynchronously detecting and holding a second sensed voltage indicative of a second peak voltage present on a ground trace in a second peak hold circuit;
   comparing the second sensed voltage stored in the peak hold circuit to the threshold voltage and generating a second comparison result; and
   synchronously storing the second comparison result using a clock signal.

4. The method as recited in claim 1 further comprising detecting the electromagnetic pulse using a plurality of asynchronous peak hold circuits in the integrated circuit.

5. The method as recited in claim 1 further comprising taking action to protect the integrated circuit without processor intervention responsive to detection of the electromagnetic pulse.

6. The method as recited in claim 1 further comprising comparing the sensed voltage to the threshold voltage in a comparator.

7. The method as recited in claim 6 further comprising programming the threshold voltage to a desired threshold voltage.

8. The method as recited in claim 1 further comprising detecting a positive peak voltage.

9. The method as recited in claim 1 further comprising detecting a negative peak voltage.

10. An integrated circuit comprising:
    a voltage regulator to provide a regulated voltage to a positive power supply trace in the integrated circuit;
    a peak hold circuit coupled to the positive power supply trace and configured to asynchronously detect a peak voltage on the positive power supply trace and hold a sensed voltage indicative of the peak voltage;
    a comparator coupled to an output of the peak hold circuit to compare the sensed voltage to a threshold voltage and supply a comparison result; and
    a storage location coupled to an output of the comparator and coupled to a clock signal to synchronously store, using the clock signal, the comparison result as an indication of whether the sensed voltage is above the threshold voltage.

11. The integrated circuit as recited in claim 10 wherein the threshold voltage is programmable.

12. The integrated circuit as recited in claim 10 further comprising:
    a second peak hold circuit coupled to a ground trace and configured to asynchronously detect a second peak voltage on the ground trace and hold a second sensed voltage indicative of the second peak voltage;
    a second comparator coupled to the second peak hold circuit to compare the second sensed voltage to the threshold voltage and supply a second comparison result; and
    a second storage location coupled to an output of the second comparator and coupled to a clock signal to synchronously store, using the clock signal, the second comparison result as an indication of whether the second sensed voltage is above the threshold voltage.

13. The integrated circuit as recited in claim 10 further comprising a plurality of additional asynchronous peak hold circuits coupled to one or more conductive traces in the integrated circuit.

14. The integrated circuit as recited in claim 13 further comprising a plurality of additional comparators coupled to the additional asynchronous peak hold circuits.

15. The integrated circuit as recited in claim 13 wherein a first plurality of the additional asynchronous peak hold circuits are sampled at a first time and a second plurality of the additional asynchronous peak hold circuits are not sampled at the first time and the second plurality of the additional asynchronous peak hold circuits are sampled at a second time and the first plurality of the additional asynchronous peak hold circuits are not sampled at the second time.

16. The integrated circuit as recited in claim 10 wherein the peak hold circuit is configured to detect a negative peak voltage.

17. The integrated circuit as recited in claim 10 further comprising:
    a ground trace in the integrated circuit;
    a second peak hold circuit coupled to the ground trace and configured to asynchronously detect a second peak voltage on the ground trace and hold a second voltage indicative of the peak voltage;
    a second comparator coupled to the second peak hold circuit to compare the second peak voltage to the threshold voltage; and
    a second storage location coupled to an output of the second comparator and coupled to the clock signal to synchronously store, using the clock signal, an indication of whether the second peak voltage is above the threshold voltage.

18. The integrated circuit as recited in claim 10 wherein the peak hold circuit comprises:
    an amplifier having a first input coupled to the positive power supply trace and a second input coupled to an output node of the peak hold circuit;
    a diode coupled between an output of the amplifier and the output node of the peak hold circuit; and
    a capacitor coupled between the output node of the peak hold circuit and ground.

19. An electromagnetic pulse detector comprising:
    a voltage regulator to supply a regulated voltage to various regions of an integrated circuit via a positive power supply trace in the integrated circuit;
    a peak hold circuit coupled to the positive power supply trace and configured to asynchronously detect a peak voltage on the positive power supply trace and hold a voltage indicative of the peak voltage on the positive power supply trace; and means for determining if the voltage is above a threshold voltage thereby indicating a voltage spike caused by an electromagnetic pulse.

20. The integrated circuit as recited in claim 19 wherein the means for determining comprises an analog to digital converter coupled to receive the voltage from the peak hold circuit and to supply a digital value of the voltage and the integrated circuit further comprises a storage coupled to the analog to digital converter to store the digital value.

21. The integrated circuit as recited in claim 19 wherein the peak hold circuit comprises:
- an amplifier having a first input coupled to the positive power supply trace and a second input coupled to an output node of the peak hold circuit;
- a diode coupled between an output of the amplifier and the output node of the peak hold circuit; and
- a capacitor coupled between the output node of the peak hold circuit and ground.

* * * * *